United States Patent [19]

Mulshine

[11] Patent Number: 4,987,512

[45] Date of Patent: Jan. 22, 1991

[54] SOLID STATE CIRCUIT PROTECTOR

[75] Inventor: James P. Mulshine, Pt. Pleasant, N.J.

[73] Assignee: Inresco, Inc., Manasquan, N.J.

[21] Appl. No.: 319,990

[22] Filed: Mar. 6, 1989

Related U.S. Application Data

[63] Continuation-in-part of Ser. No. 878,358, Jun. 25, 1986, Pat. No. 4,811,153.

[51] Int. Cl.$^5$ .............................................. H02H 3/08
[52] U.S. Cl. ........................................ 361/57; 361/58; 361/93
[58] Field of Search ....................... 361/57, 58, 91, 93, 361/111, 100, 101, 187, 103, 18

[56] References Cited

U.S. PATENT DOCUMENTS 3,792,289  2/1974  Kazem ........................... 361/100 X
3,858,089  12/1974  Poindexter ......................... 361/120

Primary Examiner—Todd E. DeBoer
Attorney, Agent, or Firm—Robert M. Skolnik

[57] ABSTRACT

A solid state circuit protector is comprised of a coil winding, a latching type Hall effect device, and a solid state switching network including an NPN bipolar junction transistor with a current limiting resistor. Other types of solid state switches can be employed instead of or in addition to the bipolar junction transistor.

6 Claims, 1 Drawing Sheet

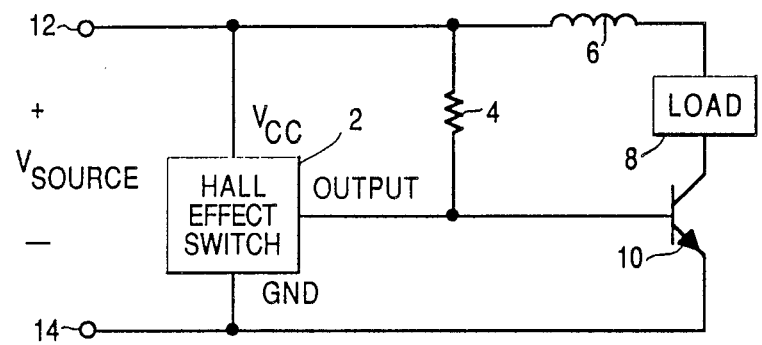
FIG. 1
FIG. 2
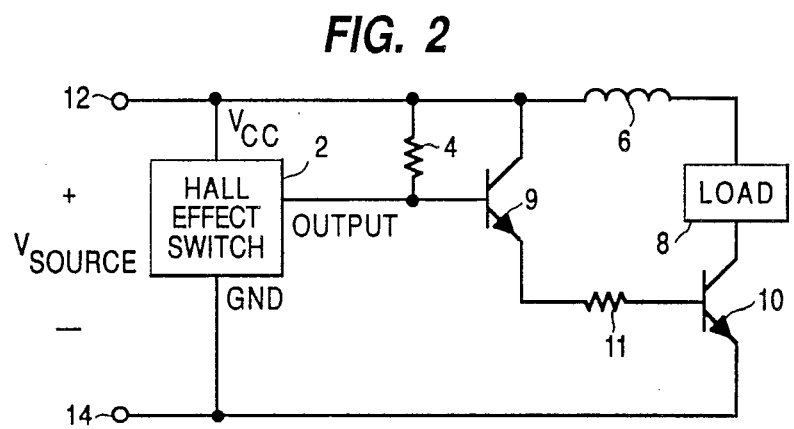

SOLID STATE CIRCUIT PROTECTOR

CROSS-REFERENCE TO RELATED APPLICATIONS

This application is a continuation-in-part of U.S. Pat. application Ser. No. 878,358, filed June 25, 1986 in the name of Michael J. Sakatos, now U.S. Pat. No. 4,811,153, issued Mar. 7, 1989.

FIELD OF THE INVENTION

The present invention relates to solid state circuit protection devices that turn off the load current when an excessive load current level is reached. A solid state switch, such as a transistor, is controlled by an electromagnetic sensing circuit. A coil winding in series with the load will produce a stronger magnetic field when an overload occurs. The increased magnetic field is detected by a magnetic sensor which causes the solid state switch to turn off.

Different types of magnetic sensors may be employed in this invention. These sensors may be, for example, a magnetic Hall effect device, a reed switch or an electromechanical switch. The preferred embodiment of the invention employs the Hall effect device because the circuit is then totally solid state with all the attendant advantages to such circuitry.

DESCRIPTION OF THE PRIOR ART

The aformentioned application of Sakatos Ser. No. 878,358, filed June 25, 1986, now U.S. Pat. No. 4,811,153, issued Mar. 7, 1989, discloses a circuit protection device employing a magnetically responsive reed switch having at least two sources of magnetic bias, one source to initiate the switching of the reeds and the other source to complete the reeds switching and maintain the reeds in the switched state. The current flows through the protector of Sakatos until a predetermined fault conditions is reached at which time the magnetic bias is changed to effect switching of the protector.

SUMMARY OF THE INVENTION

The solid state embodiment is comprised of a coil winding, a latching type Hall effect device (such as is commercially available from Sprague Electric Company, type 3075), and solid state switching network including an NPN bipolar junction transistor with a current limiting resistor. Other types of solid state switches can be employed instead of or in addition to the bipolar junction transistor.

In operation, current is caused to flow through the coil winding, load and the solid state switching element. The Hall effect device is in its OFF state because the magnetic field generated by the coil is insufficient to turn it ON. In this state, the ouput of the Hall effect device appears as a very high electrical impedance (as an open circuit). This permits current to flow to the base of the transistor. The current, limited by the current limiting resistor, is sufficient to saturate the transistor to maintain it conducting to carry the load current. When the load draws excessive current, the Hall effect switch senses the increased magnetic field from the coil and changes to the ON states at its output. The base of the transistor is now shorted to ground through the Hall effect output device causing the transistor to turn OFF stopping the load current.

At this point, the coil's field collapses, but the Hall effect switch remains on because it is of the latching type. A reduction of the source voltage will allow the Hall effect to reset to its normal OFF state, thereby resetting the circuit.

A principal object of my invention is the provision of a solid state circuit protector which avoids disadvantages associated with mechanical switches. Another object of my invention is the provision of a circuit which will respond rapidly to the occurrence of a fault condition in a load to be protected. A still further object of my invention is the use of a Hall effect device to short the circuit to ground on the occurrence of a fault condition. Another object of the invention is the provision of a coil to monitor the current flow in the load, the coil generating a magnetic field which triggers the Hall effect device.

BRIEF DESCRIPTION OF THE DRAWINGS

These as well as further objects and advantages of the invention will become apparent to those skilled in the art from a review of the following detailed specification reference being made to the accompanying drawings in which:

FIG. 1 is a schematic diagram of the circuit of the invention; and

FIG. 2 is a schematic diagram of another circuit according to the invention.

DETAILED DESCRIPTION OF THE INVENTION

Hall effect devices serve as contactless magnetically activated switches and sensors. The Hall effect device may be biased so as to produce a negligible output voltage in the absence of a magnetic field. If the biased Hall device is placed in a magnetic field with flux lines at right angles to the Hall current, the voltage output is directly proportional to the strength of the magnetic field. This is the Hall effect discovered in 1879.

FIG. 1 is a schematic diagram of the circuit employing my invention. In FIG. 1, terminals 12 and 14 denote the input terminals of the circuit protector from a voltage source. Numeral 8 denotes the load to be protected. The load 8 is connected between the collector of transistor 10 and coil 6. A Hall effect switch 2 is connected across terminals 12 and 14. The output of the Hall effect device 2 is connected to the base of transistor 10. A resistor 4 is connected across the input and the output of the Hall effect switch 2 and to coil 6.

FIG. 2 is a schematic diagram of another embodiment of the invention. Like numerals have been used to designate like elements in FIGS. 1 and 2. FIG. 2 includes another transistor 9 connected across the coil 6 and the base of transistor 10. Resistor 11 is connected in series between the emitter of transistor 9 and the base of transistor 10.

The transistors 9 and 10 in these embodiments may be NPN bipolar junction transistors. The Hall effect device is a Sprague Type 3075, or equivalent.

FIG. 1 circuit initially operates when current is caused to flow through the coil winding 6, load 8 and the solid state switching element 10. The Hall effect device 2 is biased in its OFF state because the magnetic field generated by the coil 6 is insufficient to turn it ON. In this state, the output of the Hall effect device 2 appears as a very high electrical impedance (as an open circuit). This permits current to flow to the base of the transistor 10. The current, limited by the current limiting resistor 4, is sufficient to saturate the transistor 10 to maintain it conducting to carry the load current. When the load 8 draws excessive current, the Hall effect 2 switch senses the increased magnetic field from the coil 6 and changes to the ON states at its output. The base of the transistor 10 is now shorted to ground 14 through the Hall effect output device 2 causing the transistor 10 to turn OFF stopping the load 8 current.

At this point, in coil 6 the coil's field collapses, but the Hall effect switch 2 remains on because it is of the latching type. A reduction of the source voltage (at terminals 12 and 14) will allow the Hall effect device 2 to reset to its normal OFF state, thereby resetting the circuit.

The FIG. 2 circuit operates in a manner similar to that described in connection with the circuit of FIG. 1. However, in FIG. 2, transistor 9 and resistor 11 are employed as a current amplification stage. Transistor 9 is ON while the Hall effect device 2 is OFF. Transistor 9 permits sufficient current flow therethrough to saturate the transistor 10. Higher load currents are possible in this configuration if transistor 10 is rated at higher power The circuits of FIGS. 1 and 2 may employ either a reed switch as the magnetic sensor as taught in the aforementioned Sakatos Patent or an electro-mechanical switching device as the magnetic sensor as taught in a copending application filed of even date herewith Ser. No. 320,158 of Mulshine and Sakatos entitled CIRCUIT PROTECTOR.

In one modification, a reed switch is connected in series with resistor 4 in FIG. 1, and Hall effect switch 2 is removed. A holding coil is connected across the collector and the emitter of transistor 10. This coil serves as the holding coil taught in Sakatos patent No. 4,811,153.

I claim:

1. A circuit for protecting a load from overcurrent or overvoltage conditions comprising:
   a source of input voltage which supplies current to a load a magnetic sensor switch means connected across said source of input voltage, said magnetic sensor switch means changing state in response to a sensed variation in magnetic field;
   switch means connected to said magnetic sensor switch means; magnetic field generating means connected in series with said source and said load to generate a magnetic field responsive to said current flowing to said load; said magnetic field generating means magnetically coupled to said magnetic sensor switch means to change the state of said magnetic sensor switch means in response to the magnetic field generated by a predetermined current flowing to said load to change the state of said switch means to disconnect said source from said load.

2. The circuit of claim 1 wherein said sensor switch means includes a Hall effect integrated circuit.

3. The circuit of claim 1 wherein said sensor switch means includes a reed switch.

4. The circuit of claim 1 wherein said sensor switch means includes an electro-mechanical switch.

5. A circuit for protecting a load comprising: a source of input voltage which supplies current to a load magnetic sensor switch means connected across said source of input voltage, said magnetic sensor switch means changing state in response to a variation in a magnetic field;
   switch means connected to said magnetic sensor switch means for connecting said source of input voltage to said load; magnetic field generating means magnetically coupled to said magnetic sensor switch means and connected in series with said load to generate a magnetic field responsive to said current flowing to said load and to cause said magnetic sensor switch means to change state in response to a predetermined current flowing to said load to cause said switch means to change state to disconnect said source from said load.

6. A circuit for protecting a load comprising:
   connecting means which connects the circuit to a source of input voltage which provides current to a load magnetic field sensing switch means connected across said source; switch means connected to said magnetic sensor switch means and to said connecting means for connecting said source to said load; and magnetic field generating means magnetically coupled to said magnetic sensor switch means and electrically connected to said switch means to generate a magnetic field responsive to said current flowing said load and to cause said magnetic sensor switch means to change state in response to a predetermined current flowing to said load to disconnect said source from said load.

* * * * *